(12) United States Patent
Saint-Marc et al.

(10) Patent No.: US 11,377,230 B2
(45) Date of Patent: Jul. 5, 2022

(54) TRANSVERSE FRAMEWORK INTENDED FOR AN AVIONICS BAY OF AN AIRCRAFT, ASSEMBLY MODULE AND AIRCRAFT COMPRISING THE SAID TRANSVERSE FRAMEWORK

(71) Applicant: Airbus Operations S.A.S., Toulouse (FR)

(72) Inventors: Laurent Saint-Marc, Montaigut sur Save (FR); Bernard Guering, Montrabe (FR)

(73) Assignee: Airbus Operations S.A.S.

( * ) Notice: Subject to any disclaimer, the term of this patent is extended or adjusted under 35 U.S.C. 154(b) by 293 days.

(21) Appl. No.: 16/440,077

(22) Filed: Jun. 13, 2019

(65) Prior Publication Data

US 2019/0389596 A1 Dec. 26, 2019

(30) Foreign Application Priority Data

Jun. 20, 2018 (FR) ..................................... 18 55444

(51) Int. Cl.
    *B64D 47/00*      (2006.01)
    *B64C 1/10*       (2006.01)
    *H05K 7/18*       (2006.01)
    *B64D 43/00*      (2006.01)

(52) U.S. Cl.
    CPC ................ *B64D 47/00* (2013.01); *B64C 1/10* (2013.01); *B64D 43/00* (2013.01); *H05K 7/18* (2013.01)

(58) Field of Classification Search
    CPC .......... B64D 47/00; B64D 43/00; B64C 1/10; B64C 1/22; H05K 7/18
    See application file for complete search history.

(56) References Cited

U.S. PATENT DOCUMENTS

| | | | | |
|---|---|---|---|---|
| 3,541,395 A | * | 11/1970 | Lucchino | H03K 3/286 361/693 |
| 3,972,427 A | * | 8/1976 | Stanley | B60P 1/02 244/137.1 |
| 4,089,040 A | * | 5/1978 | Paulsen | B64C 1/20 174/16.1 |
| 4,153,225 A | * | 5/1979 | Paulsen | H05K 7/20572 244/118.1 |
| 7,170,747 B2 | * | 1/2007 | Muirhead | G06F 1/182 312/265.1 |

(Continued)

FOREIGN PATENT DOCUMENTS

| | | | | |
|---|---|---|---|---|
| EP | 3091270 A1 | | 11/2016 | |
| EP | 3584164 A1 | * | 12/2019 | ............. B64D 11/00 |
| FR | 3082824 A1 | * | 12/2019 | ............... B64C 1/10 |

*Primary Examiner* — Benjamin P Lee (74) *Attorney, Agent, or Firm* — Lerner, David, Littenberg, Krumholz & Mentlik, LLP (57) ABSTRACT

A transverse framework for an avionics bay of an aircraft is delimited by a primary structure and a floor, the transverse framework having a mesh structure with square and/or rectangular mesh cells. According to one arrangement, an avionics bay of an aircraft includes two longitudinal rows of avionics racks, parallel to the longitudinal direction and arranged on each side of a clear zone, and a transverse avionics rack supported by the transverse framework situated to the rear of the two longitudinal rows of avionics racks at the rear boundary of the avionics bay. This transverse framework makes it possible to optimize the space occupied by the avionics bay.

20 Claims, 4 Drawing Sheets

(56) References Cited

U.S. PATENT DOCUMENTS

| | | | |
|---|---|---|---|
| 9,019,719 B2* | 4/2015 | Tomasi | B64D 43/00 |
| | | | 361/807 |
| 9,351,412 B2* | 5/2016 | Durand | H05K 7/1412 |
| 9,359,084 B2* | 6/2016 | Durand | B64C 1/18 |
| 9,750,162 B2* | 8/2017 | Szarek | B64D 43/00 |
| 9,878,790 B2* | 1/2018 | Burgunder | B64C 9/24 |
| 10,218,136 B2* | 2/2019 | Szarek | H05K 7/20354 |
| 10,893,624 B2* | 1/2021 | Guering | B64D 43/00 |
| 2003/0042359 A1* | 3/2003 | Lambiaso | H01Q 1/28 |
| | | | 244/118.1 |
| 2003/0155319 A1 | 8/2003 | Wishart et al. | |
| 2011/0127379 A1* | 6/2011 | Jager | B64C 1/18 |
| | | | 244/118.1 |
| 2012/0062084 A1 | 3/2012 | Lewis, II et al. | |
| 2013/0084792 A1* | 4/2013 | Guering | B64C 1/18 |
| | | | 454/76 |
| 2016/0176537 A1* | 6/2016 | Rodriguez | H05K 7/18 |
| | | | 224/401 |
| 2017/0118873 A1* | 4/2017 | Szarek | B64D 43/00 |
| 2019/0132980 A1* | 5/2019 | Guering | B64D 43/00 |
| 2019/0185130 A1* | 6/2019 | Guering | B64D 43/00 |
| 2019/0389555 A1* | 12/2019 | Guering | B64D 11/04 |

* cited by examiner

TRANSVERSE FRAMEWORK INTENDED FOR AN AVIONICS BAY OF AN AIRCRAFT, ASSEMBLY MODULE AND AIRCRAFT COMPRISING THE SAID TRANSVERSE FRAMEWORK

FIELD OF THE INVENTION

The present application relates to a transverse framework intended for an avionics bay of an aircraft and to an assembly module and an aircraft comprising the said transverse framework.

BACKGROUND OF THE INVENTION

Figure 1:
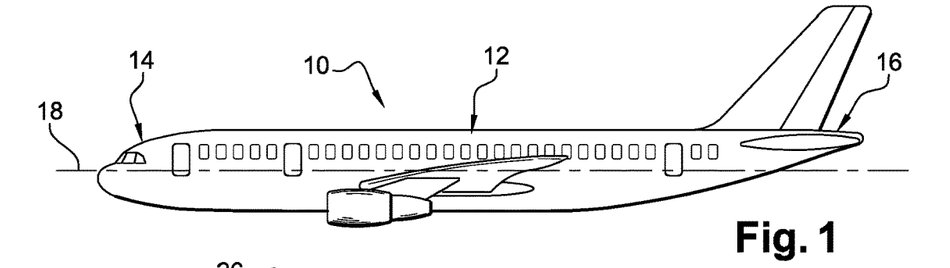
FIG. 1 is a side view of an aircraft.

FIG. 1 depicts an aircraft 10 comprising a fuselage 12 made up of a several sections positioned end to end, which extends between a nosecone 14 corresponding to the forwardmost section and a tail cone 16 corresponding to the rearmost section.

For the rest of the description, a longitudinal axis 18 of the aircraft 10 corresponds to the axis which is horizontal, when the aircraft 10 is on the ground, which extends from the nosecone 14 to the tail cone 16 of the aircraft 10. A longitudinal direction is a direction parallel to the longitudinal axis 18. A longitudinal plane is a plane which is parallel to the longitudinal axis 18. A transverse plane is a plane perpendicular to the longitudinal axis 18.

Like all the sections, the nosecone 14 comprises a primary structure which comprises transverse stiffeners referred to as frames, longitudinal stiffeners referred to as stringers, and a skin which forms the external envelope of the aircraft. The nosecone 14 comprises a floor connected to the primary structure which divides the nosecone into two zones, an upper zone which corresponds to a flight deck and a lower zone which corresponds to an avionics bay. The nosecone 14 also comprises a secondary structure which comprises panels which compartmentalize and cover the inside of the primary structure and various equipment, accessories, racks which are connected to the primary structure.

According to one assembly technique described in document FR3051176, the floor and the secondary elements situated above the floor of the nosecone are assembled to form a self-supporting assembly module which is introduced into and immobilized in the primary structure. The self-supporting assembly module is assembled and equipped with the various elements of the secondary structure at the same time as the primary structure is being assembled. Thus, the mounting of the elements of the secondary structure is performed as a parallel process thereby contributing to improving aircraft assembly rates. Once the self-supporting assembly module has been fitted, the avionics bay situated under the floor is equipped.

Figures 2, 3:
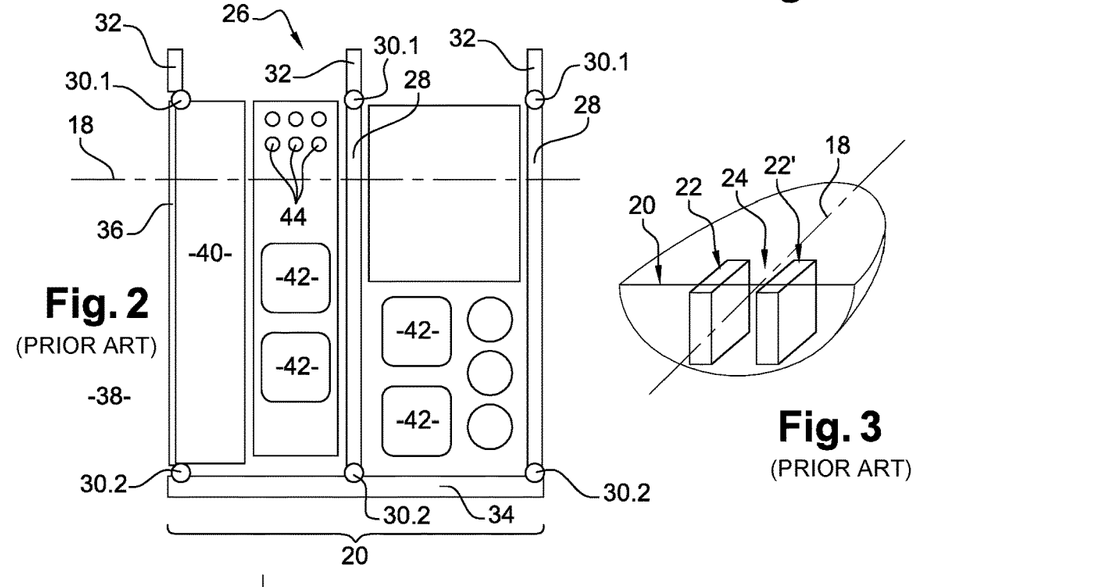
FIG. 2 is a schematic depiction, in plan view, of a rear avionics rack illustrating one embodiment of an arrangement of the prior art.
FIG. 3 is a schematic perspective depiction of avionics racks positioned in an avionics bay illustrating one arrangement of the prior art.

According to a configuration described in document FR 3000030 and indicated schematically in FIG. 3, an avionics bay 20 comprises two rows of avionics racks 22, 22', 26 parallel to the longitudinal axis 18, arranged on either side of a single passageway 24 and symmetrically with respect to a vertical longitudinal midplane PMV. Thus, each row comprises at least a front avionics rack, in which an electrical core and elements that complement the electrical core are arranged, and at least one rear avionics rack 26, visible in FIG. 2.

Each rear avionics rack 26, positioned on either side of the single passageway 24, comprises a bearing structure 28 connected, in the upper part, to the floor 32 at several connecting points 30.1 and, in the lower part, to the primary structure 34 of the nosecone 14 at several connecting points 30.2. Each rear avionics rack 26 comprises, at the rear, a pressure bulkhead 36 delimiting the avionics bay 20 and the luggage bay 38; and, at the front of the pressure bulkhead 36, a retention zone 40 intended to absorb load if a container in the luggage bay 38 should break free. Each rear avionics rack 26 performs a supporting function and comprises compartments in which equipment 42 such as batteries or inertial units are housed. The rear avionics racks 26 positioned on either side of the passageway act as supports for transverse electrical pathways 44 and transverse fluid ducting 46.

This avionics bay arrangement is not fully satisfactory because it is not optimal in terms of compactness.

BRIEF SUMMARY OF THE INVENTION

Aspects of the present invention may overcome all or some of the disadvantages of the prior art.

An embodiment of the invention is a transverse framework for an avionics bay of an aircraft delimited by a primary structure and a floor, characterized in that the transverse framework comprises:
  vertical connecting rods, positioned in a first transverse plane, which each comprise, at an upper end, a first connection configured to be connected to an anchor point provided in the floor and, at a lower end, a second connection configured to be connected to an anchor point provided in the primary structure,
  first horizontal transverse members, connecting the connecting rods in pairs, and positioned in the first transverse plane,
  vertical uprights, positioned in a second transverse plane spaced away from the first transverse plane,
  second horizontal transverse members, connecting the uprights in pairs, and positioned in the second transverse plane,
  horizontal longitudinal members oriented perpendicular to the first transverse plane, connecting the connecting rods and the uprights in pairs,
  the connecting rods, the uprights, the first and second transverse members and the longitudinal members being arranged in such a way that the transverse framework forms a mesh structure with square and/or rectangular mesh cells.

This transverse framework makes it possible to optimize the space occupied by the avionics bay, as part of the passageway provided between the longitudinal avionics racks of the prior art is occupied by the transverse framework. With this configuration, all the avionics bay equipment is accessible from the clear zone or from the luggage bay. Optimizing the space occupied by the avionics bay makes it possible to increase the volume of the luggage bay.

According to another feature, at least certain mesh cells of the transverse framework comprise oblique reinforcers so as to obtain a latticework structure.

According to one configuration, at least some of the oblique reinforcers are positioned at longitudinal vertical mesh cells and are inclined downwards and towards the first transverse plane.

According to another feature, the transverse framework comprises inclined hangers each connecting the upper end of a connecting rod and an upright.

According to one configuration, the longitudinal members and the first and second transverse members are arranged in the uppermost one same horizontal plane, form a top horizontal support, and some of the inclined hangers are connected to the uprights in such a way as to clear part of the top horizontal support facing towards the second transverse plane.

According to another feature, the transverse framework comprises at least one shelf board positioned on at least one of the horizontal mesh cells and forming a shelf.

According to one configuration, the transverse framework comprises at least one sliding connection connecting equipment and the transverse framework and configured to allow said equipment translational movement in a direction perpendicular to the first transverse plane with respect to the transverse framework.

According to one embodiment, the first and second transverse members positioned between two consecutive vertical longitudinal planes can be removed so as to split the transverse framework into two subassemblies.

Another subject of the invention is an assembly module intended to be inserted into a primary structure of a nosecone of an aircraft comprising a floor, an upper secondary structure and a transverse framework according to one of the preceding features.

Another subject of the invention is an aircraft comprising an avionics bay separated from a second bay by a rear boundary and a transverse framework according to an embodiment of the invention, the first transverse plane of the transverse framework being positioned perpendicular to a longitudinal direction of the aircraft, at the rear boundary.

According to another feature, the transverse framework comprises a pressure bulkhead bearing against the connecting rods and providing sealing between the avionics bay and the second bay, the said pressure bulkhead comprising at least one opening and, for each opening, a blowout panel configured to occupy a state of rest in which the blowout panel blanks off the opening and a post-blowout detached state in which the blowout panel at least partially uncovers the opening.

According to one embodiment, the pressure bulkhead comprises an opening for each transverse vertical mesh cell situated at the first transverse plane and, for each zone situated between the connecting rods, above the uppermost first transverse members.

According to one arrangement, the avionics bay comprises two longitudinal rows of avionics racks parallel to the longitudinal direction and arranged on either side of a clear zone, a transverse avionics rack supported by the transverse framework situated to the rear of the two longitudinal rows of avionics racks.

BRIEF DESCRIPTION OF THE DRAWINGS

Further features and advantages will become apparent from the following description of the invention, which description is given solely by way of example with reference to the attached drawings among which.

DETAILED DESCRIPTION

Figure 16:
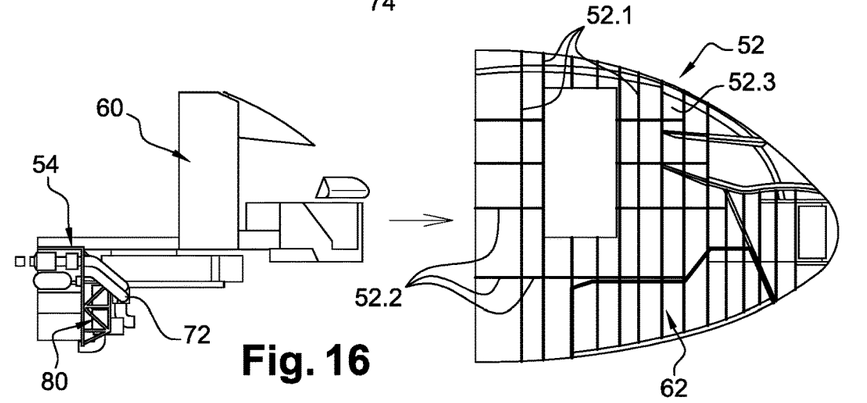
FIG. 16 is a side view of the assembly module visible in FIG. 15 and of a nosecone of an aircraft prior to a step of fitting the said assembly module into the nosecone.
Figure 17:
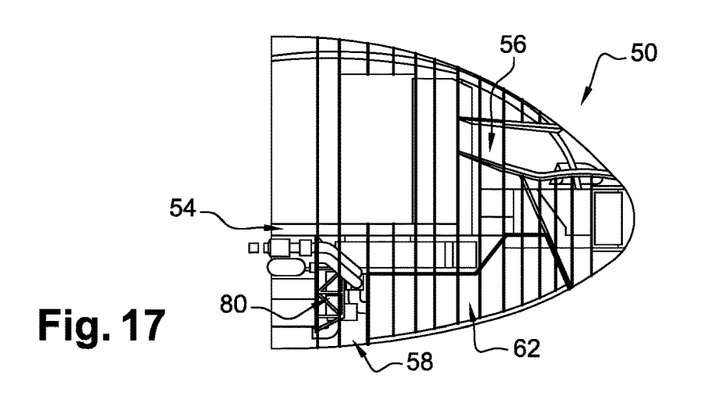
FIG. 17 is a lateral view of the assembly module and of the nosecone which are visible in FIG. 16, after the step of fitting the said assembly module into the nosecone.

According to one embodiment illustrated by FIGS. 16 and 17, a nosecone 50 of an aircraft comprises a primary structure 52 which comprises transverse stiffeners 52.1, referred to as frames, longitudinal stiffeners 52.2 referred to as stringers and a skin 52.3 which forms the outer envelope of the aircraft. The nosecone 50 comprises a floor 54 connected to the primary structure 52 and which divides the nosecone into two zones, an upper zone which corresponds to a flight deck 56 and a lower zone which corresponds to an avionics bay 58. The nosecone 50 also comprises an upper secondary structure 60, visible in FIG. 16, which comprises panels which compartmentalize and cover the inside of the primary structure 52 and various equipment, accessories, racks which are positioned on top of the floor 54 once assembled.

Figure 4:
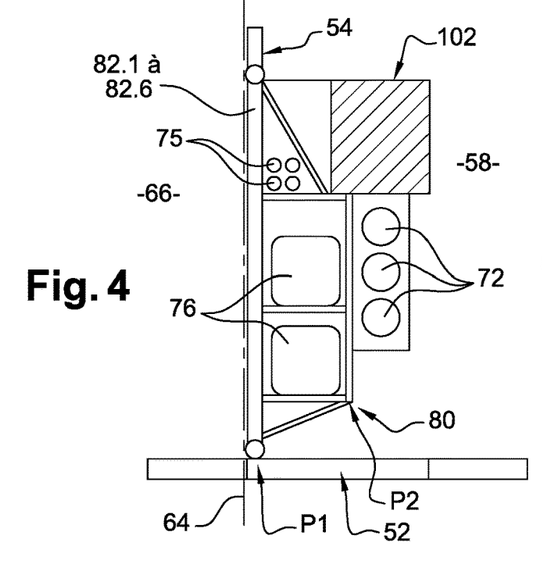
FIG. 4 is a schematic cross section through a transverse framework illustrating one embodiment of the invention.
Figure 5:
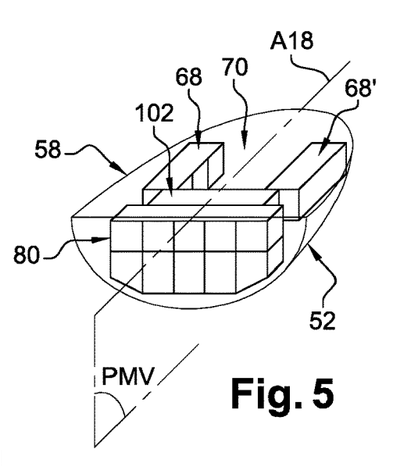
FIG. 5 is a schematic perspective depiction of avionics racks and of a transverse framework which are positioned in an avionics bay of an aircraft illustrating one arrangement of the invention.

According to a configuration visible in FIGS. 4, 5 and 17, the avionics bay 58 is delimited by the floor 54 at the top, the primary structure 52 at the bottom and on the sides, a front landing gear compartment 62 at the bottom and a rear boundary 64 (visible in FIG. 4) which separates the avionics bay 58 from a second bay, notably from a luggage bay 66.

Figure 9:
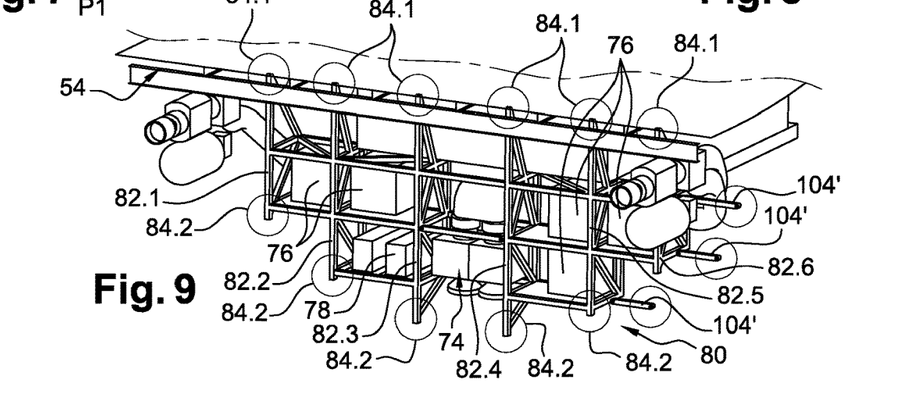
FIG. 9 is a perspective view of the transverse framework visible in FIG. 6, positioned under a floor of a nosecone of an aircraft.
Figure 10:
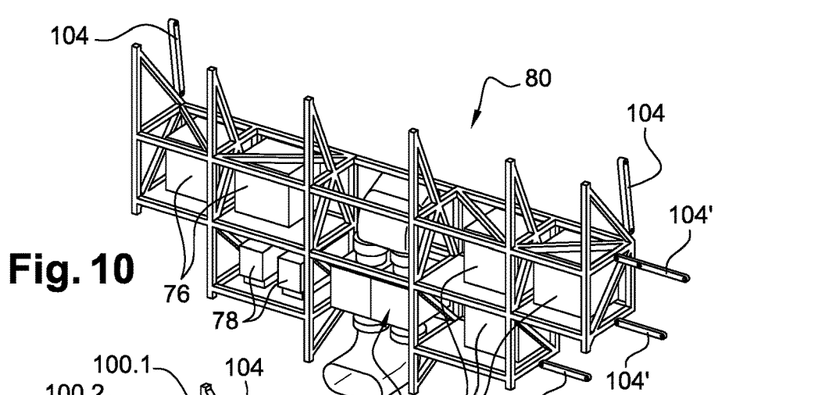
FIG. 10 is a perspective view, from the rear, of the transverse framework visible in FIG. 6 supporting some of its equipment.
Figure 11:
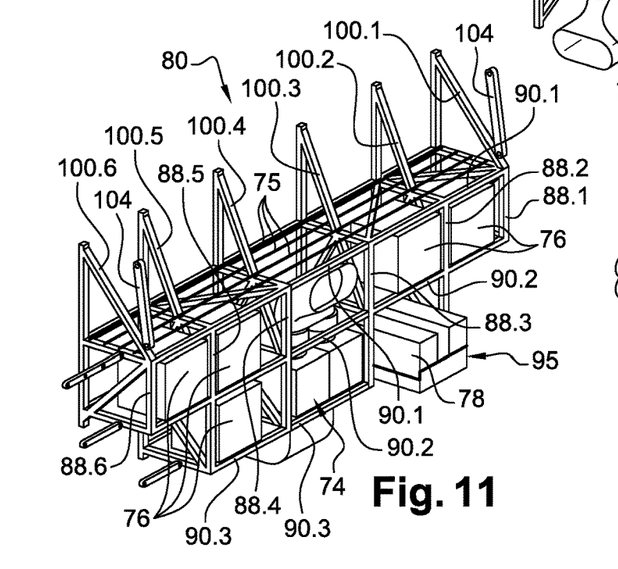
FIG. 11 is a perspective view, from the front, of the transverse framework visible in FIG. 6 supporting some of its equipment.
Figure 12:
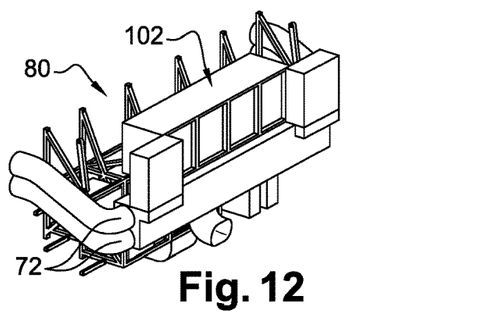
FIG. 12 is a perspective view, from the front, of the transverse framework visible in FIG. 6, supporting all of its equipment.
Figure 13:
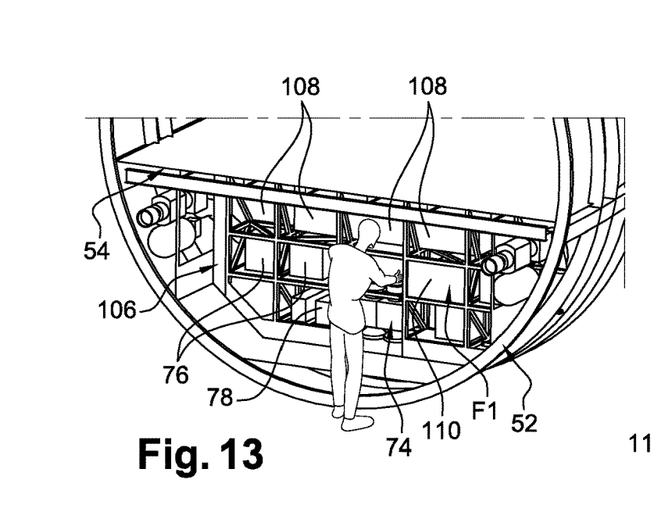
FIG. 13 is a perspective view, from the rear, of the transverse framework visible in FIG. 6 positioned in an avionics bay, equipped with at least one pressure bulkhead and illustrating one embodiment of the invention.

According to one configuration, the avionics bay 58 comprises:

above the front landing gear compartment 62, two longitudinal rows of avionics racks 68, 68', parallel to the longitudinal axis 18, arranged on either side of a clear zone 70 and symmetrically with respect to a vertical midplane PMV which passes through the longitudinal axis A18, an air conditioning device which has transverse ducting 72 (visible in FIGS. 4 and 12) positioned in transverse planes, to the rear of the front landing gear compartment 62, and an air treatment system 74 (visible in FIGS. 9, 10, 11, 13 and 15) positioned to the rear of the front landing gear compartment 62, electrical pathways 75 (visible in FIGS. 4 and 11), other equipment such as batteries 76 (visible in FIGS. 4, 9, 10, 11 and 15) and inertial units 78 (visible in FIGS. 10, 11 and 13).

All of these elements are not described further because they are known to those skilled in the art.

According to one feature of the invention, the avionics bay 58 comprises a transverse framework 80 positioned to the rear of the front landing gear compartment 62.

According to one embodiment visible in FIGS. 6 to 8 and 11, the transverse framework 80 comprises:

vertical connecting rods 82.1 to 82.6, positioned in a first transverse plane P1, which each comprise, at an upper end, a first connection 84.1 configured to be connected to an anchor point provided in the floor 54 and, at a lower end, a second connection 84.2 configured to be connected to an anchor point provided in the primary structure 52, first horizontal transverse members 86.1 to 86.3, connecting the connecting rods 82.1 to 82.6 in pairs, and positioned in the first transverse plane P1, vertical uprights 88.1 to 88.6, positioned in a second transverse plane P2 parallel to the plane P1 and spaced away therefrom, second horizontal transverse members 90.1 to 90.3, connecting the uprights 88.1 to 88.6 in pairs, and positioned in the second transverse plane P2, horizontal longitudinal members 92 oriented perpendicular to the first transverse plane P1, connecting the connecting rods 82.1 to 82.6 and the uprights 88.1 to 88.6 in pairs.

Figures 6, 7, 8:
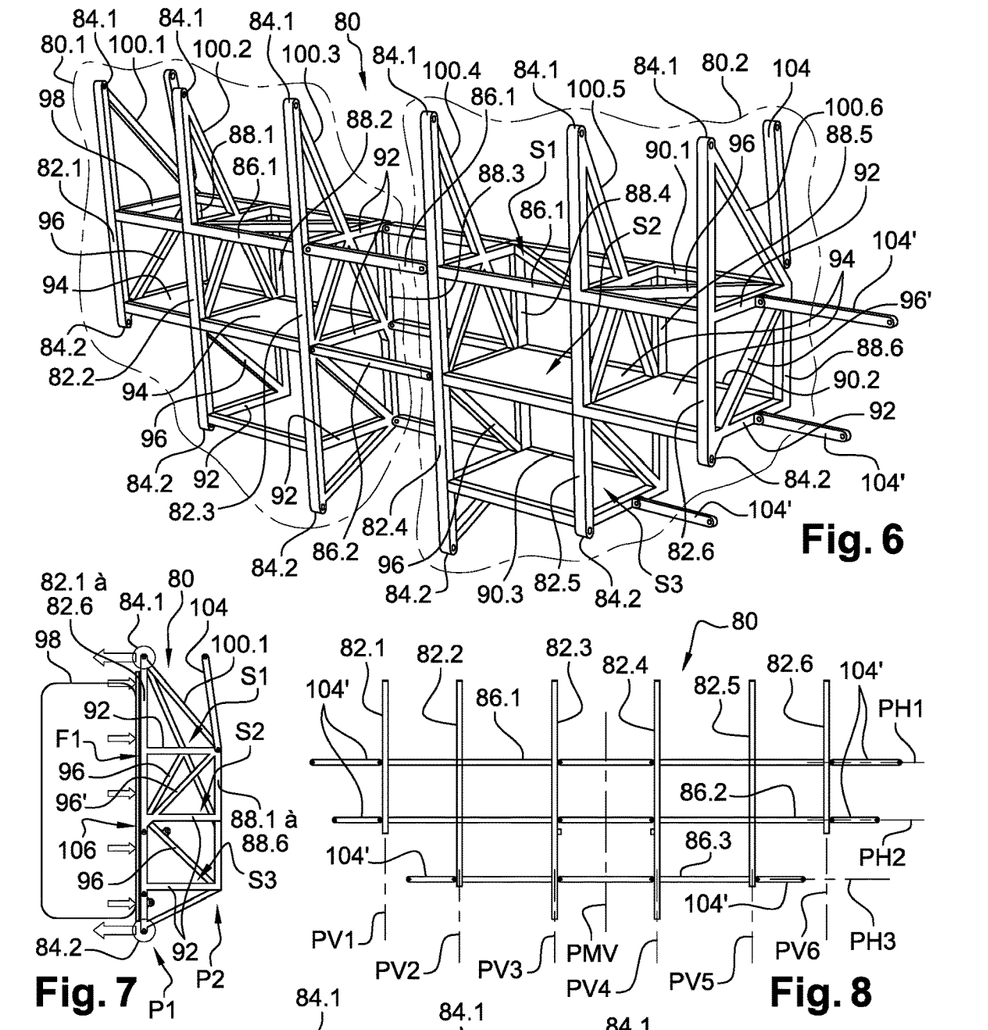
FIG. 6 is a perspective view of a transverse framework illustrating one embodiment of the invention.
FIG. 7 is a side view of the transverse framework visible in FIG. 6.
FIG. 8 is a front-on view of the transverse framework visible in FIG. 6.

The connecting rods 82.1 to 82.6 are arranged symmetrically with respect to the vertical midplane PMV. According to one configuration, the transverse framework 80 comprises six connecting rods 82.1 to 82.6 distributed across the entire width of the avionics bay 58, the width corresponding to the dimension of the bay in the first transverse plane P1. The connecting rods are numbered 82.1 to 82.6 from left to right, when looking from the rear of the aircraft forwards.

The connecting rods 82.1 to 82.6 are connected by a first series of top first transverse members 86.1 positioned in the one same first horizontal longitudinal plane PH1, by a second series of intermediate first transverse members 86.2 positioned in the one same second horizontal longitudinal plane PH2 and by a third series of bottom first transverse members 86.3 positioned in the one same third horizontal longitudinal plane PH3.

According to one configuration, the first and second connecting rods 82.1 and 82.2 are connected by a top first transverse member 86.1 and by an intermediate first transverse member 86.2; the second and third connecting rods 82.2 and 82.3 are connected by a top first transverse member 86.1, an intermediate first transverse member 86.2 and a bottom first transverse member 86.3; the third and fourth connecting rods 82.3 and 82.4 are connected by a top first transverse member 86.1 and an intermediate first transverse member 86.2; the fourth and fifth connecting rods 82.4 and 82.5 are connected by a top first transverse member 86.1, an intermediate first transverse member 86.2 and a bottom first transverse member 86.3, and the fifth and sixth connecting rods 82.5 and 82.6 are connected by a top first transverse member 86.1 and an intermediate first transverse member 86.2.

The transverse framework 80 comprises as many uprights 88.1 to 88.6 as there are connecting rods 82.1 to 82.6. Thus, the transverse framework 80 comprises six uprights 88.1 to 88.6 distributed across the entire width of the avionics bay 58, the uprights 88.1 to 88.6 being arranged respectively in the same vertical longitudinal planes PV1 to PV6 as the connecting rods 82.1 to 82.6.

The uprights 88.1 to 88.2 are connected by a first series of top second transverse members 90.1 positioned in the same first horizontal longitudinal plane PH1 as the top first transverse members 86.1, by a second series of intermediate second transverse members 90.2 positioned in the same second horizontal longitudinal plane PH2 as the intermediate first transverse members 86.2 and by a third series of bottom second transverse members 90.3 positioned in the same third horizontal longitudinal plane PH3 as the bottom first transverse members 86.3.

According to one configuration, the first and second uprights 88.1 and 88.2 are connected by a top second transverse member 90.1 and an intermediate second transverse member 90.2; the second and third uprights 88.2 and 88.3 are connected by a top second transverse member 90.1 and an intermediate second transverse member 90.2; the third and fourth uprights 88.3 and 88.4 are connected by a top second transverse member 90.1, an intermediate second transverse member 90.2 and a bottom second transverse member 90.3; the fourth and fifth uprights 88.4 and 88.5 are connected by a top second transverse member 90.1, an intermediate second transverse member 90.2 and a bottom second transverse member 90.3, and the fifth and sixth uprights 88.5 and 88.6 are connected by a top second transverse member 90.1 and an intermediate second transverse member 90.2.

According to one embodiment visible in FIG. 11, the first and sixth uprights 88.1 and 88.6 connect the top second transverse members 90.1 and the intermediate second transverse members 90.2 and do not extend beyond these. The other uprights 88.2 to 88.5 connect the top second transverse members 90.1 and the bottom second transverse members 90.3 and do not extend beyond these.

According to one configuration, each junction point at which the connecting rods 82.1 to 82.6 and the first transverse members 86.1 to 86.3 meet is connected by a longitudinal member 92 to the corresponding junction point (same vertical longitudinal plane PV1 to PV6 and same horizontal longitudinal plane PH1 to PH3) where the uprights 88.1 to 88.6 and the second transverse members 90.1 to 90.3 meet.

Of course, the invention is not restricted to this number of connecting rods and of uprights, or to this configuration for the first and second transverse members.

Whatever the embodiment, the connecting rods 82.1 to 82.6, the uprights 88.1 to 88.6, the first and second transverse members 86.1 to 86.3 and 90.1 to 90.3 and the longitudinal members 92 are arranged in such a way that the transverse framework 80 forms a mesh structure with square and/or rectangular mesh cells; two longitudinal members 92, a first transverse member 86.1 to 86.3 and a second transverse member 90.1 to 90.3 forming a horizontal mesh cell; two longitudinal members, a connecting rod 82.1 to 82.6 and an upright 88.1, 88.6 forming a longitudinal vertical mesh cell; two first transverse members 86.1 to 86.3 and two connecting rods 82.1 to 82.6 or two second transverse members 90.1 to 90.3 and two uprights 88.1 to 88.6 forming a transverse vertical mesh cell.

According to one embodiment, the transverse framework 80 is made of metal and of all-welded construction. Of course, the invention is not restricted to this material or production method.

According to one configuration visible in FIGS. 6 and 11, the first and second transverse members, arranged between two consecutive vertical longitudinal planes PV3 and PV4, connecting the third and fourth connecting rods 82.3 and 82.4 and the third and fourth uprights 88.3 and 88.4 can be removed. Thus, the transverse framework 80 comprises two all-welded subassemblies 80.1, 80.2 which are manufactured independently of one another and which can be connected to the floor 54 independently of one another.

According to one configuration, the first transverse plane P1, in which the connecting rods 82.1 to 82.6 are positioned, is offset towards the rear with respect to the second transverse plane P2 in which the uprights 88.1 to 88.6 are positioned. The first transverse plane P1 forms a frontal face F1 of the transverse framework 80 which is accessible from the luggage bay 66.

The first and second transverse members 88.1 to 86.3; 90.1 to 90.3 and the longitudinal members 82 arranged in the same horizontal longitudinal plane PH1 or PH3 form a continuous or discontinuous horizontal support. Thus, the transverse framework 80 comprises a top horizontal support S1 arranged in the horizontal longitudinal plane PH1, an intermediate horizontal support S2 arranged in the horizontal longitudinal plane PH2 and a bottom horizontal support S3 arranged in the horizontal longitudinal plane PH3.

According to one embodiment, the transverse framework 80 comprises at least one shelf board 94, positioned at at least one of the horizontal mesh cells and supported by two longitudinal members 92, a first transverse member 86.1 to 86.3 and a second transverse member 90.1 to 90.3. Each shelf board 94 has an outline substantially identical to the horizontal mesh cell that accommodates it. This shelf board 94 forms a shelf.

These shelf boards 94 are positioned according to the equipment installed in the transverse framework 80. By way of example, they are used to support the batteries 76.

According to one embodiment, the transverse framework 80 comprises at least one sliding connection 95 (visible in FIG. 11), such as two rails, connecting equipment and the transverse framework 80 and configured to allow the said equipment a translational movement, with respect to the transverse framework, in a direction perpendicular to the first transverse plane P1, to allow it to be extracted.

The transverse framework 80 comprises at least one oblique reinforcer 96. At least certain mesh cells of the transverse framework 80 comprise oblique reinforcers 96 so as to obtain a latticework structure. The oblique reinforcers 96 are positioned in such a way as to enhance the absorption of load in the longitudinal direction, from front to rear. Thus, the oblique reinforcers 96 are provided at least at certain longitudinal vertical mesh cells and/or horizontal mesh cells. Thus, as illustrated in FIG. 7, the transverse framework 80 provides effective absorption of load should a container 98 break free.

At least some of these oblique reinforcers 96', arranged at the longitudinal vertical mesh cells, inclined downwards and towards the first transverse plane, transmit load applied on the second transverse plane P2 towards the anchor points provided on the primary structure 52.

The transverse framework 80 comprises inclined hangers 100.1 to 100.6, each of them connecting the upper end of a connecting rod 82.1 to 82.6 and an upright 88.1 to 88.6. These inclined hangers 100.1 to 100.6 transmit the load applied on the second transverse plane P2 towards the anchor points provided on the floor 54.

Figure 15:
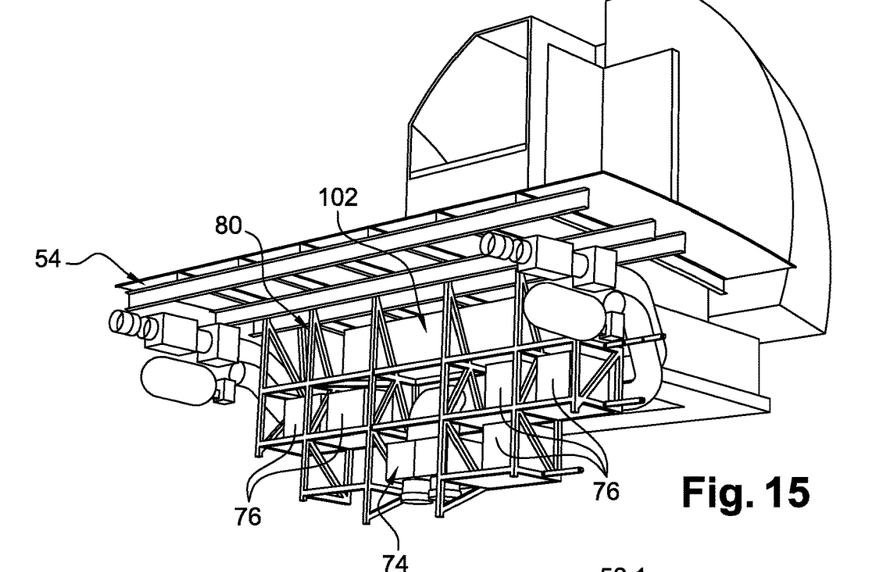
FIG. 15 is a perspective view of an assembly module comprising a transverse framework illustrating one embodiment of the invention.

According to one configuration, the transverse framework 80 comprises end inclined hangers 100.1, 100.6 connecting the upper ends of the first and last connecting rods 82.1, 82.6 and of the first and last uprights 88.1, 88.6, and intermediate inclined hangers 100.2 to 100.5 connecting the upper end of the connecting rods 82.2 to 82.5 and the uprights 88.2 to 88.5 at the level of the intermediate second transverse members 90.2. Thus, part of the top horizontal support S1 oriented towards the second transverse plane P2 is clear and is not impeded by the intermediate inclined hangers 100.2 to 100.5 which means that this space can house a transverse avionics rack 102 situated to the rear of the two longitudinal rows of avionics racks 68, 68', as illustrated in FIGS. 5, 9 and 15.

The inclined hangers 100.1 to 100.6 and the oblique reinforcers 96, 96' allow load to be transferred from the second transverse plane P2 to the first transverse plane P1 which means that there is no need for the uprights 88.1 to 88.6 to be connected to the floor 54 or to the primary structure 52. This design makes it possible to reduce the number of fixing points between the transverse framework 80 and the primary structure 52/the floor 54.

According to another feature, the transverse framework 80 comprises tie rods 104 for connecting it to the primary structure 52 or to the floor 54. According to one configuration, two tie rods 104 connect the upper ends of the first and last uprights 88.1 and 88.6 and the floor 54. Tie rods 104' connect the longitudinal members 92 positioned at each end of the horizontal supports S1 to S3, the tie rods 104' being positioned in a transverse plane (parallel to the first and second transverse planes P1 and P2) positioned between the first and second transverse planes P1 and P2 and absorbing load in a horizontal transverse direction.

According to one embodiment visible in FIG. 13, the frontal face F1 of the transverse framework 80 comprises a pressure bulkhead 106, sealing between the avionics bay 58 and the luggage bay 66, bearing against the connecting rods 82.1 to 82.6. In order to provide access to the transverse framework 80, the pressure bulkhead 106 comprises at least one opening 108. According to one configuration, the pressure bulkhead 106 comprises an opening 108 for each transverse vertical mesh cell situated in the first transverse plane P1 and for each zone situated between the connecting rods 82.1 to 82.6 above the top first transverse members 86.1.

For each opening 108, the pressure bulkhead 106 comprises a blowout panel 110. Each blowout panel 110 is configured to occupy a rest state, visible in FIG. 14A, in which it closes off the opening 108, a post-blowout detached state, visible in FIG. 14B, in which it at least partially uncovers the opening 108, and an unmounted state, visible in FIG. 14C, in which it completely uncovers the opening 108 to allow access to the transverse framework 80 from the luggage bay 66.

Figure 14A:
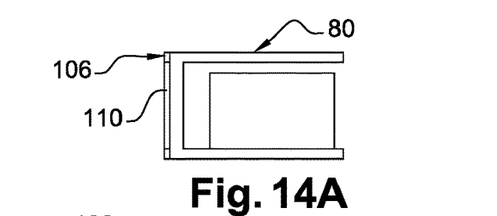
FIG. 14A is a schematic side view of a pressure bulkhead, in the state of rest.
Figure 14B:
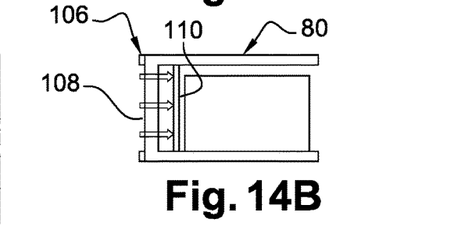
FIG. 14B is a schematic side view of the pressure bulkhead visible in FIG. 14A, in the post-blowout detached state.
Figure 14C:
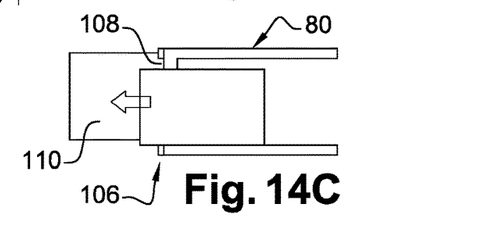
FIG. 14C is a schematic side view of the pressure bulkhead visible in FIG. 14B, in the unmounted state.

To that end, the pressure bulkhead 106 comprises, for each blowout panel 110, a connection connecting the said blowout panel 110 to the rest of the pressure bulkhead 106, and configured to provide sealing, in the state of rest, between the said blowout panel 110 and the rest of the pressure bulkhead 106, and to blowout when a pressure difference across the pressure bulkhead 106 exceeds a given threshold in order to pass from the state of rest to the detached state, so as to allow the said blowout panel 110 to be unmounted and refitted.

According to one embodiment, at least one connection (preferably four connections at each corner of the blowout panel 110) is provided to tether the blowout panel 110 to the rest of the pressure bulkhead 106 so as to limit the travel of the blowout panel 110 when passing from the state of rest to the detached state in the event of overpressure.

According to one arrangement visible in FIGS. 4, 12 and 15, the electrical pathways 75 are positioned on the rear part of the top horizontal support S1. A transverse avionics rack 102 is positioned, at least partially, on the front part of the top horizontal support S1. Transverse ducting 72 is fixed to the uprights 88.1 to 88.2 and/or to the second transverse members 90.1 to 90.3, underneath the transverse avionics rack 102. An air treatment system 74 is positioned between the third and fourth connecting rods 82.3, 82.4. Finally, batteries 76 and inertial units 78 are positioned on the intermediate horizontal support S2 and the bottom horizontal support S3 on either side of the third and fourth connecting rods 82.3, 82.4. Of course, the invention is not restricted to this arrangement. Other arrangements are conceivable.

According to an assembly method, an assembly module 112, comprising the floor 54, the upper secondary structure 60, the transverse framework 80 and its equipment is assembled, the transverse framework 80 being fixed to the floor 54 using the first connections 84.1 and the tie rods 104. This operation may be realised at the same time as the primary structure 52 of the nosecone.

Next, the assembly module 112 is inserted into the primary structure 52 and connected to the said primary structure 52. The transverse framework 80 is fixed to the primary structure 52 using the second connections 84.2 and the tie rods 104'.

The pressure bulkhead 106 is fitted together with the blowout panels 110 before or after the insertion of the assembly module 112.

As illustrated in FIGS. 4 and 5, the transverse framework 80 makes it possible to optimize the use of space by the avionics bay 58, part of the passageway provided between the longitudinal avionics racks 68, 68' of the prior art being occupied by the transverse framework 80. With this configuration, all of the equipment of the avionics bay 58 is accessible from the clear zone 70 or from the luggage bay 66. Optimizing the space occupied by the avionics bay 58 makes it possible to increase the volume of the luggage bay 66.

The presence of removable blowout panels 110 on the pressure bulkhead 106 makes the equipment installed on the transverse framework 80 more accessible.

The meshwork (possibly strengthened) structure of the transverse framework makes it possible to reduce the retention zone intended for absorbing load in the event of a container in the luggage bay 66 breaking free, thereby ultimately making it possible to increase the volume of the luggage bay 66.

According to another aspect, the transverse framework 80 comprises a reduced number of connections with the floor 54 and the primary structure 52, thereby making it possible to reduce assembly time. Furthermore, because these connections are positioned in the first transverse plane P1, they are easily accessible from the luggage bay 66.

Finally, the transverse framework 80 means that the equipment present in the avionics bay 58 can be secured to an assembly module and introduced, in a single step, into the primary structure 52 of the aircraft.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An aircraft comprising:
an avionics bay separated from a second bay by a rear boundary and a transverse framework for the avionics bay, the avionics bay being delimited by a primary structure and a floor, and wherein the transverse framework comprises:
vertical connecting rods, positioned in a first transverse plane, which each comprise, at an upper end, a first connection connected to an anchor point provided in the floor and, at a lower end, a second connection connected to an anchor point provided in the primary structure,
first horizontal transverse members, connecting the vertical connecting rods in pairs, and positioned in the first transverse plane,
vertical uprights, positioned in a second transverse plane spaced away from the first transverse plane,
second horizontal transverse members, connecting the vertical uprights in pairs, and positioned in the second transverse plane
horizontal longitudinal members oriented perpendicular to the first transverse plane, connecting the vertical connecting rods and the vertical uprights in pairs,
wherein the vertical connecting rods, the vertical uprights, the first and second transverse members and the longitudinal members are arranged in such a way that the transverse framework forms a mesh structure with square and/or rectangular mesh cells,
wherein the transverse framework comprises inclined hangers each connecting a vertical connecting rod and a vertical upright,
wherein the longitudinal members and the first and second transverse members are arranged in the uppermost one same horizontal plane, form a top horizontal support, and
wherein some of the inclined hangers are connected to the vertical uprights in such a way as to clear part of the top horizontal support facing towards the second transverse plane.

2. The aircraft according to claim 1, wherein at least certain mesh cells of the transverse framework comprise oblique reinforcers so as to obtain a latticework structure.

3. The aircraft according to claim 2, wherein at least some of the oblique reinforcers are positioned at longitudinal vertical mesh cells and are inclined downwards and towards the first transverse plane.

4. The aircraft according to claim 1, wherein the transverse framework comprises at least one shelf board positioned on at least one of the horizontal mesh cells and forming a shelf.

5. The aircraft according to claim 1, wherein the first and second transverse members positioned between two consecutive vertical longitudinal planes are configured to be removed so as to split the transverse framework into two subassemblies.

6. The aircraft according to claim 1, wherein the avionics bay comprises two longitudinal rows of avionics racks parallel to a longitudinal direction and arranged on either side of a clear zone, and a transverse avionics rack supported by the transverse framework situated to the rear of the two longitudinal rows of avionics racks.

7. An aircraft comprising:
an avionics bay separated from a second bay by a rear boundary and a transverse framework for the avionics bay, the avionics bay being delimited by a primary structure and a floor, and wherein the transverse framework comprises:
vertical connecting rods, positioned in a first transverse plane, which each comprise, at an upper end, a first connection connected to an anchor point provided in the floor and, at a lower end, a second connection connected to an anchor point provided in the primary structure,
first horizontal transverse members, connecting the vertical connecting rods in pairs, and positioned in the first transverse plane,
vertical uprights, positioned in a second transverse plane spaced away from the first transverse plane,
second horizontal transverse members, connecting the vertical uprights in pairs, and positioned in the second transverse plane,
horizontal longitudinal members oriented perpendicular to the first transverse plane, connecting the vertical connecting rods and the vertical uprights in pairs,
wherein the vertical connecting rods, the vertical uprights, the first and second transverse members and the longitudinal members are arranged in such a way that the transverse framework forms a mesh structure with square and/or rectangular mesh cells, and
wherein the transverse framework comprises at least one sliding connection connecting equipment and the transverse framework and configured to allow said equipment translational movement in a direction perpendicular to the first transverse plane with respect to the transverse framework.

8. The aircraft according to claim 7, wherein at least certain mesh cells of the transverse framework comprise oblique reinforcers so as to obtain a latticework structure.

9. The aircraft according to claim 8, wherein at least some of the oblique reinforcers are positioned at longitudinal vertical mesh cells and are inclined downwards and towards the first transverse plane.

10. The aircraft according to claim 7, wherein the transverse framework comprises inclined hangers each connecting a vertical connecting rod and a vertical upright.

11. The aircraft according to claim 10, wherein the longitudinal members and the first and second transverse members are arranged in the uppermost one same horizontal plane, form a top horizontal support, and wherein some of the inclined hangers are connected to the vertical uprights in such a way as to clear part of the top horizontal support facing towards the second transverse plane.

12. The aircraft according to claim 7, wherein the transverse framework comprises at least one shelf board positioned on at least one of the horizontal mesh cells and forming a shelf.

13. The aircraft according to claim 7, wherein the transverse framework comprises at least one sliding connection connecting equipment and the transverse framework and configured to allow said equipment translational movement in a direction perpendicular to the first transverse plane with respect to the transverse framework.

14. The aircraft according to claim 7, wherein the first and second transverse members positioned between two consecutive vertical longitudinal planes are configured to be removed so as to split the transverse framework into two subassemblies.

15. The aircraft according to claim 7, wherein the first transverse plane of the transverse framework is positioned perpendicular to a longitudinal direction of the aircraft, at the rear boundary.

16. The aircraft according to claim 15, wherein the transverse framework comprises a pressure bulkhead bearing against the vertical connecting rods and providing sealing between the avionics bay and the second bay, the pressure bulkhead comprising at least one opening and, for each opening, a blowout panel configured to occupy a state of rest in which the blowout panel blanks off the opening and a post-blowout detached state in which the blowout panel at least partially uncovers the opening.

17. The aircraft according to claim 16, wherein the pressure bulkhead comprises an opening for each transverse vertical mesh cell situated at the first transverse plane and for each zone situated between the vertical connecting rods above the uppermost first transverse members.

18. The aircraft according to claim 7, wherein the avionics bay comprises two longitudinal rows of avionics racks parallel to a longitudinal direction and arranged on either side of a clear zone, and a transverse avionics rack supported by the transverse framework situated to the rear of the two longitudinal rows of avionics racks.

19. An aircraft comprising:
an avionics bay separated from a second bay by a rear boundary and a transverse framework for the avionics bay, the avionics bay being delimited by a primary structure and a floor, and wherein the transverse framework comprises:
vertical connecting rods, positioned in a first transverse plane, which each comprise, at an upper end, a first connection connected to an anchor point provided in the floor and, at a lower end, a second connection connected to an anchor point provided in the primary structure,
first horizontal transverse members, connecting the vertical connecting rods in pairs, and positioned in the first transverse plane,
vertical uprights, positioned in a second transverse plane spaced away from the first transverse plane,
second horizontal transverse members, connecting the vertical uprights in pairs, and positioned in the second transverse plane,
horizontal longitudinal members oriented perpendicular to the first transverse plane, connecting the vertical connecting rods and the vertical uprights in pairs, wherein the vertical connecting rods, the vertical uprights, the first and second transverse members and the longitudinal members are arranged in such a way that the transverse framework forms a mesh structure with square and/or rectangular mesh cells, wherein the first transverse plane of the transverse framework is positioned perpendicular to a longitudinal direction of the aircraft, at the rear boundary, and wherein the transverse framework comprises a pressure bulkhead bearing against the vertical connecting rods and providing sealing between the avionics bay and the second bay, the pressure bulkhead comprising at least one opening and, for each opening, a blowout panel configured to occupy a state of rest in which the blowout panel blanks off the opening and a post-blowout detached state in which the blowout panel at least partially uncovers the opening.

20. The aircraft according to claim 19, wherein the pressure bulkhead comprises an opening for each transverse vertical mesh cell situated at the first transverse plane and for each zone situated between the vertical connecting rods above the uppermost first transverse members.

* * * * *